United States Patent
Lee et al.

(10) Patent No.: US 7,138,340 B2
(45) Date of Patent: Nov. 21, 2006

(54) METHOD FOR FABRICATING SEMICONDUCTOR DEVICE WITHOUT DAMAGING HARD MASK DURING CONTACT FORMATION PROCESS

(75) Inventors: Sung-Kwon Lee, Ichon-shi (KR); Tae-Woo Jung, Ichon-shi (KR)

(73) Assignee: Hynix Semiconductor Inc., Kyougki-do (KR)

( * ) Notice: Subject to any disclaimer, the term of this patent is extended or adjusted under 35 U.S.C. 154(b) by 6 days.

(21) Appl. No.: 10/866,968

(22) Filed: Jun. 15, 2004

(65) Prior Publication Data

US 2005/0136683 A1 Jun. 23, 2005

(30) Foreign Application Priority Data

Dec. 18, 2003 (KR) ...................... 10-2003-0093096

(51) Int. Cl.
*H01L 21/302* (2006.01)
*H01L 21/461* (2006.01)

(52) U.S. Cl. ...................... 438/737; 438/738; 438/740; 257/E21.252; 257/E21.507; 257/E21.583

(58) Field of Classification Search ...................... None
See application file for complete search history.

(56) References Cited

U.S. PATENT DOCUMENTS

| | | | | |
|---|---|---|---|---|
| 6,342,449 | B1 * | 1/2002 | Miyakawa | 438/692 |
| 6,562,714 | B1 * | 5/2003 | Lee | 438/637 |
| 6,635,576 | B1 * | 10/2003 | Liu et al. | 438/700 |
| 2002/0110966 | A1 * | 8/2002 | Lee | 438/184 |

* cited by examiner

*Primary Examiner*—Alexander Ghyka
(74) *Attorney, Agent, or Firm*—Finnegan, Henderson, Farabow, Garrett & Dunner, L.L.P.

(57) ABSTRACT

Disclosed is a method for fabricating a semiconductor device without damaging a hard mask of a conductive structure. The method includes the steps of: forming a plurality of conductive structures on a substrate, each conductive structure including a conductive layer and a hard mask; sequentially forming a first nitride layer, an oxide layer, a second nitride layer, and an etch stop layer on the plurality of conductive structures; forming an inter-layer insulation layer on the etch stop layer; removing a portion of the inter-layer insulation layer through a planarization process; performing a self-aligned etching (SAC) process selectively etching the inter-layer insulation layer, the second nitride layer and the oxide layer until the SAC etching process is stopped at the first nitride layer to thereby form a contact hole exposing the first nitride layer; and removing the first nitride layer by performing a blanket etch-back process to thereby expose the conductive layer.

18 Claims, 6 Drawing Sheets

METHOD FOR FABRICATING SEMICONDUCTOR DEVICE WITHOUT DAMAGING HARD MASK DURING CONTACT FORMATION PROCESS

FIELD OF THE INVENTION

The present invention relates to a method for fabricating a semiconductor device; and, more particularly, to a method for fabricating a semiconductor device capable of preventing losses of a hard mask of a conductive structure during a contact formation.

DESCRIPTION OF RELATED ARTS

A trend of a large-scale of integration has brought a need to form semiconductor devices densely within a confined cell region. Thus, sizes of unit devices of a semiconductor device, for instance, transistors and capacitors, have been gradually decreased. Particularly, in a dynamic random access memory (DRAM) device, sizes of the unit devices formed within a cell region have been decreased as the design rule has been shifted towards minimization. For instance, DRAM devices are currently formed to have a minimum linewidth less than 0.1 μm and are often required to have a linewidth less than 80 nm. Hence, there exist many difficulties in applying conventional fabrication methods.

In case of applying a photolithography using a light source of ArF having a wavelength of 193 nm to a semiconductor device having a linewidth less than 80 nm, it is necessary to develop an additional process recipe for preventing a photoresist deformation created during an etching process employed for the purposes of precisely forming a pattern and a vertical etch profile.

Meanwhile, advancement in an integration level of a semiconductor device has led device elements to be formed in stacks. A contact plug or a pad is one example of the stack structure.

For the contact plug, a landing plug contact (LPC) is commonly formed since the LPC has a bottom portion which makes a wide contact within a minimum area and a top portion which is wider than the bottom portion to increase a contact margin.

A self-aligned contact (SAC) etching process is adopted to form a LPC between structures having a high aspect ratio. The SAC etching process is a method of forming a contact by carrying out an etching process to a bottom structure having a specific etch selectivity ratio. Generally, the SAC etching process uses different etch selectivity ratios between nitride and oxide.

Generally, the SAC etching process uses an etch gas selected from families of CF and CHF. Also, it is required to form nitride layers for forming an etch stop layer and a spacer to prevent bottom conductive structures from being damaged.

For instance, in case of a gate electrode, a nitride-based spacer is formed on top and sidewalls of the gate electrode. Because of an increased aspect ratio, the spacer is formed in stacks of nitride layers. A buffer oxide layer is formed between these nitride layers in order to suppress generation of cracks caused by a stress induced between the nitride layers or between the nitride layer and a substrate. A typical example of such spacer is a triple stack structure of a nitride layer, an oxide layer and a nitride layer. This triple stack structure is called NON structure.

In addition, an etch stop layer made of nitride is formed on the NON structure in order to prevent conductive structures from being damaged during a cell contact formation process.

Hereinafter, a conventional method for forming a cell contact with use of the above-described gate electrode structure having the NON structure and the etch stop layer will be described.

FIGS. 1A to 1D are cross-sectional views illustrating a conventional method for forming a cell contact.

Figure 1A:
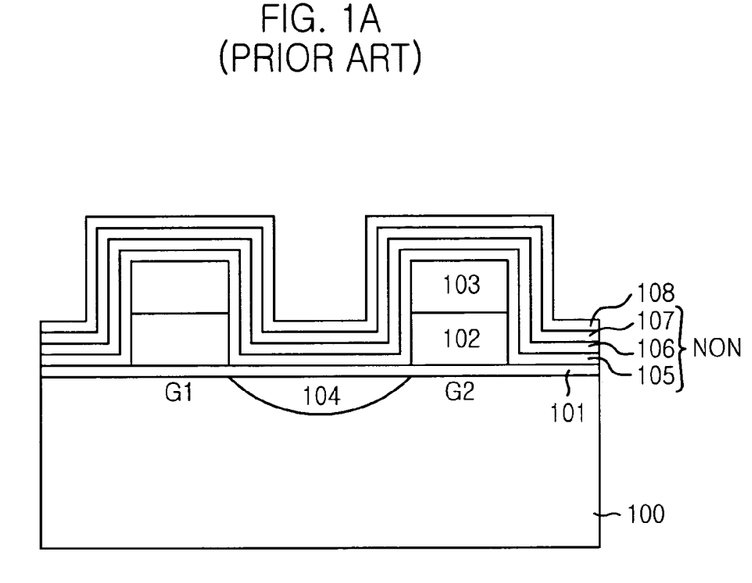
FIGS. 1A to 1D are cross-sectional views illustrating a conventional method for forming a cell contact.

Referring to FIG. 1A, a plurality of gate electrode structures G1 and G2 are formed on a substrate 100. Each of the gate electrode structure includes a gate hard mask 103, a gate conductive layer 102 and a gate insulation layer 101.

The gate insulation layer 101 is made of a typical oxide-based material such as silicon oxide, while the gate conductive layer 102 is made of a material selected in single or in combination from a group of polysilicon, tungsten (W), tungsten nitride (WN), and tungsten silicide ($WSi_x$).

The gate hard mask 103 is a protective layer for the gate conductive layer 102 in the course of forming a contact hole by etching an inter-layer insulation layer which will be subsequently formed. Thus, the gate hard mask 103 is made of a material having a significantly different etch selectivity ratio from the inter-layer insulation layer. For instance, if the inter-layer insulation layer is made of an oxide-based material, the gate hard mask 103 is made of a nitride-based material such as silicon nitride (SiN) or silicon oxynitride (SiON). If the inter-layer insulation layer is made of a polymer-based low dielectric material, the gate hard mask 103 is made of an oxide-based material.

Also, an impurity diffusion region 104 such like a source/drain junction is formed in a predetermined portion of the substrate 100 disposed between the gate electrode structures G1 and G2.

After the formation of the plurality of gate electrode structures G1 and G2, a sealing nitride layer 105, a buffer oxide layer 106 and a spacer nitride layer 107 are sequentially formed on the gate electrode patterns G1 and G2. Herein, a reference denotation NON expresses the above mentioned NON structure including the sealing nitride layer 105, the buffer oxide layer 106 and the spacer nitride layer 107.

Next, an etch stop layer 108 is formed on the spacer nitride layer 107 in order to stop an etching and thus to prevent bottom semiconductor structures, e.g., the gate electrode structures G1 and G2, from being damaged during a SAC etching process. At this time, the etch stop layer 108 is preferably formed along a profile of the spacer nitride layer 107 and is made of a nitride-based material.

Figure 1B:
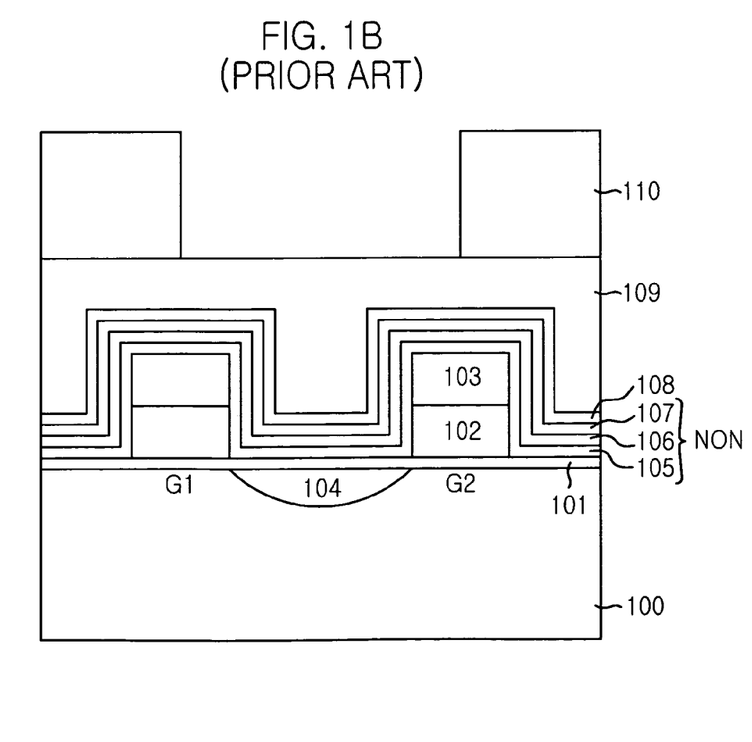

Referring to FIG. 1B, the aforementioned inter-layer insulation layer 109 which is made of an oxide-based material is formed on the etch stop layer 108. Examples of the oxide-based material are borosilicate glass (BSG), borophosphosilicate glass (BPSG), phosphosilicate glass (PSG), tetraethylorthosilicate (TEOS), high density plasma (HDP) oxide, spin on glass (SOG), advanced planarization layer (APL) and the like. In addition to the oxide-based materials, the inter-layer insulation layer 109 can be made of an organic or inorganic low dielectric material.

A photoresist pattern 110 for forming a cell contact is formed on the inter-layer insulation layer 109. Although not illustrated, it is possible to form an anti-reflective coating layer between the photoresist pattern 110 and the inter-layer insulation layer 109.

Figure 1C:
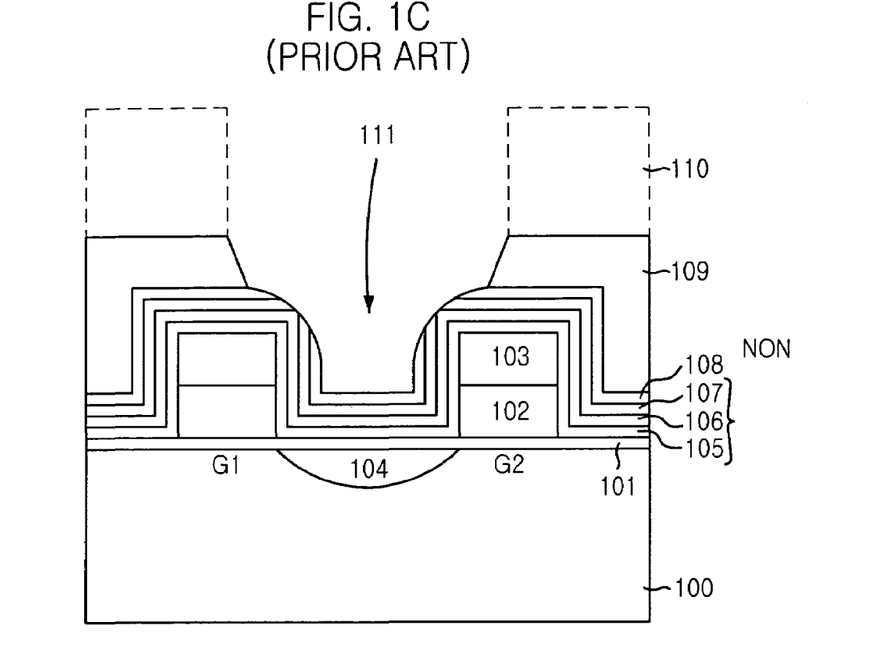

Referring to FIG. 1C, the inter-layer insulation layer 109 is etched by performing a SAC etching process with use of the photoresist pattern 110 as an etch mask. At this time, the SAC etching process proceeds under the use of different etch selectivity ratios between the inter-layer insulation layer 109 and the gate hard mask 103. Also, this SAC etching process stops at the etch stop layer 108. From this SAC etching process, a contact hole 111 is formed. Thereafter, the photoresist pattern 110 is removed through an ashing process. If the anti-reflective coating layer is made of an organic material, the anti-reflective coating layer is also simultaneously removed during this ashing process.

Figure 1D:
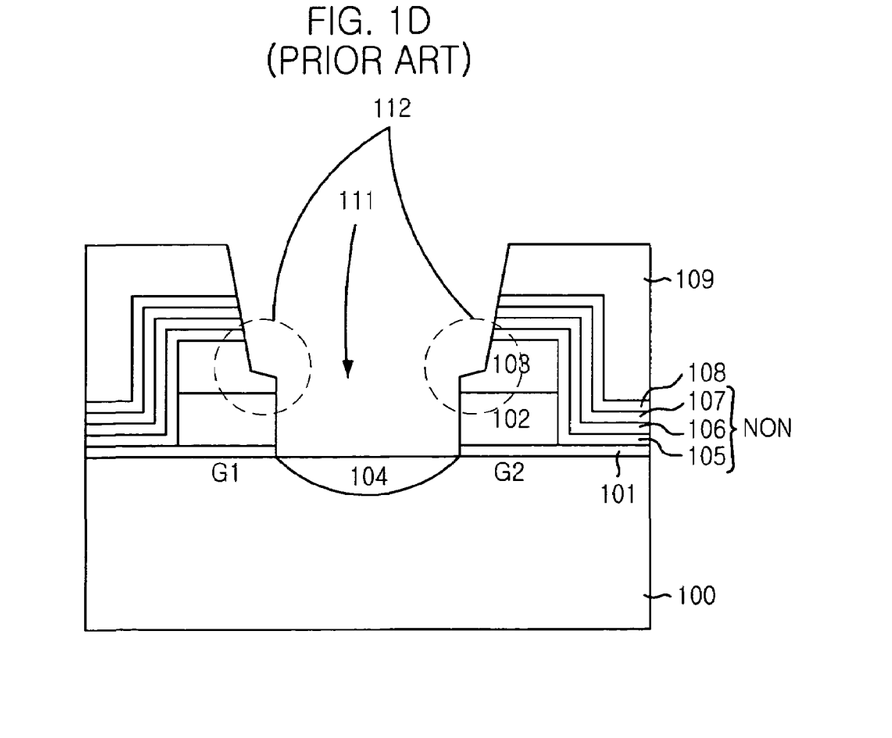

Referring to FIG. 1D, a contact hole opening process is performed to expose the impurity diffusion region 104 disposed beneath a bottom of the contact hole 111 by removing the etch stop layer 108, the NON structure and the gate insulation layer 101. Then, a cleaning process for removing etch remnants and extending an opening of the contact hole 111 is performed.

For the SAC etching process and the contact hole opening process, a combined gas of $C_xF_y$, where x and y representing atomic ratios range from 1 to 10, and $C_aH_bF_c$, where a, b and c representing atomic ratios range from 1 to 10, is used.

Although not illustrated, after the cleaning process, a conducting material for forming a plug is filled into the contact hole 111. Then, a chemical mechanical polishing (CMP) process is performed under a target of exposing a surface of the gate hard mask 103, so that a plug electrically connected to the impurity diffusion region 104 through the contact hole 111 is formed.

Meanwhile, because of the large-scale of integration, heights of the gate electrode structures G1 and G2 become augmented. Thus, a thickness of an etch target increases, inevitably resulting in overuse of an etch gas and an elongated etch time. As a result, the gate hard mask 103 is lost as denoted with the reference numeral 112 in FIG. 1D.

The loss of the gate hard mask 103 has a great impact on device operations. For instance, if the gate hard mask 103 which will be flowed in a subsequent process remains in small amounts, there arises a short between devices due to a failure in the self-aligned contact. Therefore, one important purpose of the cell contact formation process is to make the gate hard mask 103 remain with maximally allowable amounts.

Figure 2:
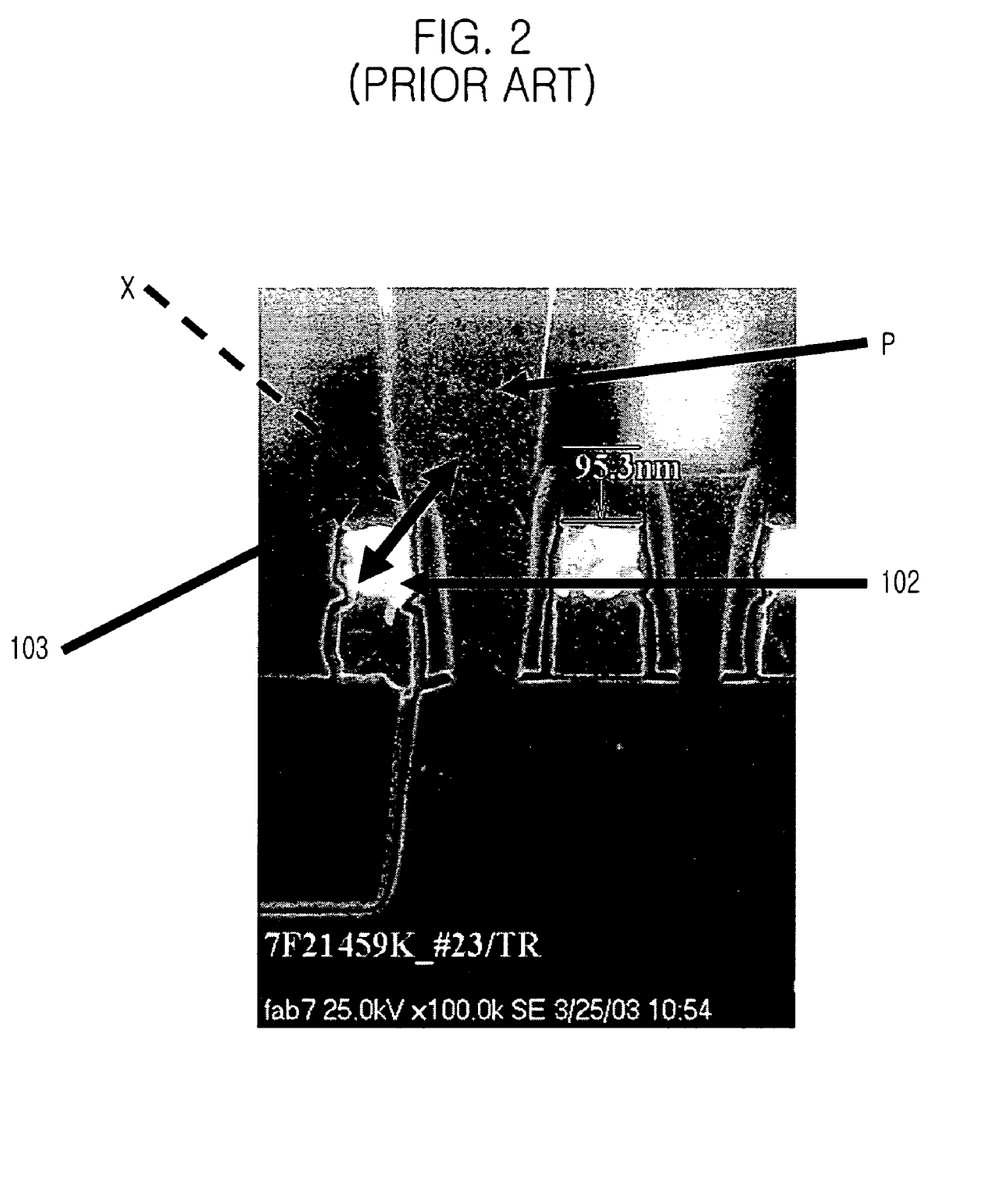
FIG. 2 is a picture of scanning electron microscopy showing a cross-sectional view of a semiconductor device in which an electric short circuit occurs between a plug and a gate conductive layer due to a failure in a self-aligned contact.

FIG. 2 is a picture of scanning electron microscopy showing a cross-sectional view of a semiconductor device in which an electric short circuit occurs between a plug and a gate conductive layer due to a failure in a self-aligned contact.

As shown, a gate hard mask 103 is damaged during a blanket etch-back process, thereby resulting in an exposure of a gate conductive layer 102. Because of this exposed gate conductive layer 102, there arises an electric short circuit X between the gate conductive layer 102 and a plug P.

Among various processes causing the loss of the gate hard mask, the removal of the etch stop layer, the NON structure and the gate insulation layer is the most difficult process to make the loss of the gate hard mask minimal. Since the blanket etch-back process is applied under a target of over-etching the etch stop layer, the NON structure and the gate insulation layer for securing a sufficient contact hole opening, it is difficult to minimize the loss of the gate hard mask 103.

In the U.S. Pat. No. 6,486,016 issued to J. S. Kim and et al. on Nov. 26, 2002, entitled "Method for Forming Self Aligned Contacts," of which contents being incorporated hereby reference, it is proposed to use a capping layer made of undoped silicate glass (USG) in order to prevent the gate hard mask from being damaged during a blanket etch-back process.

For instance, in a device having a linewidth less than 80 nm, a remaining etch stop layer after the SAC etching process has a thickness of 250 Å. Under consideration of the over-etch, it is expected that a thickness of the lost gate hard mask is 400 Å. However, if the capping layer made of undoped silicate glass (USG) is used, it is possible to compensate the loss of the gate hard mask up to a thickness of 200 Å.

However, it is nearly impossible to apply this capping layer to a device having a linewidth of 60 nm since there may be problems of a failure in opening a contact and generation of particles induced from the additionally formed layers, e.g., the capping layer.

SUMMARY OF THE INVENTION

It is, therefore, an object of the present invention to provide a method for fabricating a semiconductor device capable of preventing a hard mask of a conductive structure from being damaged during a contact formation process.

In accordance with an aspect of the present invention, there is provided a method for fabricating a semiconductor device, including the steps of: forming a plurality of conductive structures on a substrate, each conductive structure including a conductive layer and a hard mask; sequentially forming a first nitride layer, an oxide layer, a second nitride layer, and an etch stop layer on the plurality of conductive structures; forming an inter-layer insulation layer on the etch stop layer; removing a portion of the inter-layer insulation layer through a planarization process; performing a self-aligned contact (SAC) etching process selectively etching the inter-layer insulation layer, the second nitride layer and the oxide layer until the SAC etching process is stopped at the first nitride layer to thereby form a contact hole exposing the first nitride layer; and removing the first nitride layer by performing a blanket etch-back process to thereby expose the conductive layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device without damaging a hard mask during a contact formation process in accordance with a preferred embodiment of the present invention will be described in detail with reference to the accompanying drawings, which is set forth hereinafter.

FIGS. 3A to 3E are cross-sectional views illustrating a method for forming a contact in accordance with a preferred embodiment of the present invention.

Figure 3A:
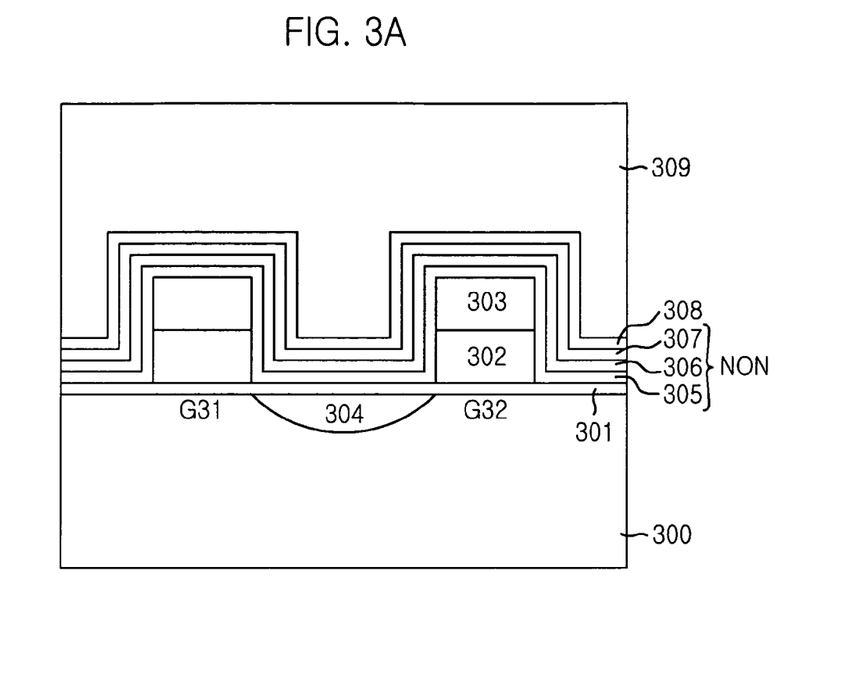
FIGS. 3A to 3E are cross-sectional views illustrating a method for forming a contact in accordance with a preferred embodiment of the present invention.

Referring to FIG. 3A, a plurality of gate electrode structures G31 and G32 are formed on a substrate 300. Herein, each of the gate electrode structure G31 and G32 includes a gate hard mask 303, a gat conductive layer 302 and a gate insulation layer 301.

The gate insulation layer 301 is made of a typical oxide-based material such as silicon oxide, while the gate conductive layer 302 is made of a material selected in single or in combination from a group consisting of polysilicon, tungsten (W), tungsten nitride (WN) and tungsten nitride ($Wsi_x$).

The gate hard mask 303 serves a role in protecting the gate conductive layer 302 in the course of forming a contact hole by etching an inter-layer insulation layer which will be subsequently formed. Thus, the gate hard mask 303 is made of a material having a different etch selectivity from the inter-layer insulation layer. For instance, if the inter-layer insulation layer is made of an oxide-based material, the gate hard mask 303 is made of a nitride-based material such as silicon nitride or silicon oxynitride (SiON). If the inter-layer insulation layer is made of a polymer-based low dielectric material, the gate hard mask 303 is made of an oxide-based material.

There is an impurity diffusion region 304 such as a source/drain junction in a predetermined portion of the substrate 300 disposed between the gate electrode structures G31 and G32.

After the formation of the gate electrode structures G31 and G32, a first nitride layer 305, an oxide layer 306 and a second nitride layer 307 are sequentially formed on the gate electrode structures G31 and G32. Herein, the first nitride layer 305, the oxide layer 306 and the second nitride layer 307 form a structure of nitride, oxide and nitride (NON). This NON structure is expressed with a reference denotation of NON.

Then, an etch stop layer 308 for stopping a SAC etching is formed on the second nitride layer 307 so as to prevent the gate electrode structures G31 and G32 from being damaged during a subsequent SAC etching process. At this time, the etch stop layer 308 is preferably formed along a profile of the second nitride layer 307 and is made of a nitride-based material.

Herein, the second nitride layer 307 is formed by employing a plasma enhanced chemical vapor deposition (PECVD) method, so that the second nitride layer 307 is removed by the subsequent SAC etching process. Also, the second nitride layer 307 can be formed in multiple nitride layers.

Meanwhile, the first nitride layer 305 is made of a nitride-based material having a higher density than a material used for forming the second nitride layer 307. Also, the first nitride layer 305 is formed by employing a low pressure chemical vapor deposition (LPCVD) method.

In more detail of the nitride-based material for use in the first nitride layer 305, it is possible to use a common nitride material such as silicon nitride or silicon oxynitride. The first nitride layer 305 can be also made of a combined material of aluminum oxide ($Al_2O_3$) and tantalum nitride (TaN) to thereby provide the first nitride layer 305 with a stronger etch tolerance than the second nitride layer 307. Because of the stronger etch tolerance, the first nitride layer 305 can serve as an etch stop layer for the subsequent SAC etching process.

Next, the aforementioned inter-layer insulation layer 309 made of an oxide-based material is formed on the etch stop layer 308. Examples of the oxide-based material are borosilicate glass (BSG), borophosphosilicate glass (BPSG), phosphosilicate glass (PSG), tetraethylorthosilicate (TEOS), high density plasma (HDP) oxide, spin on glass (SOG) and advanced planarization layer (APL). In addition to the use of the oxide-based material, the inter-layer insulation layer 309 can be made of an organic or inorganic low dielectric material.

Figure 3B:
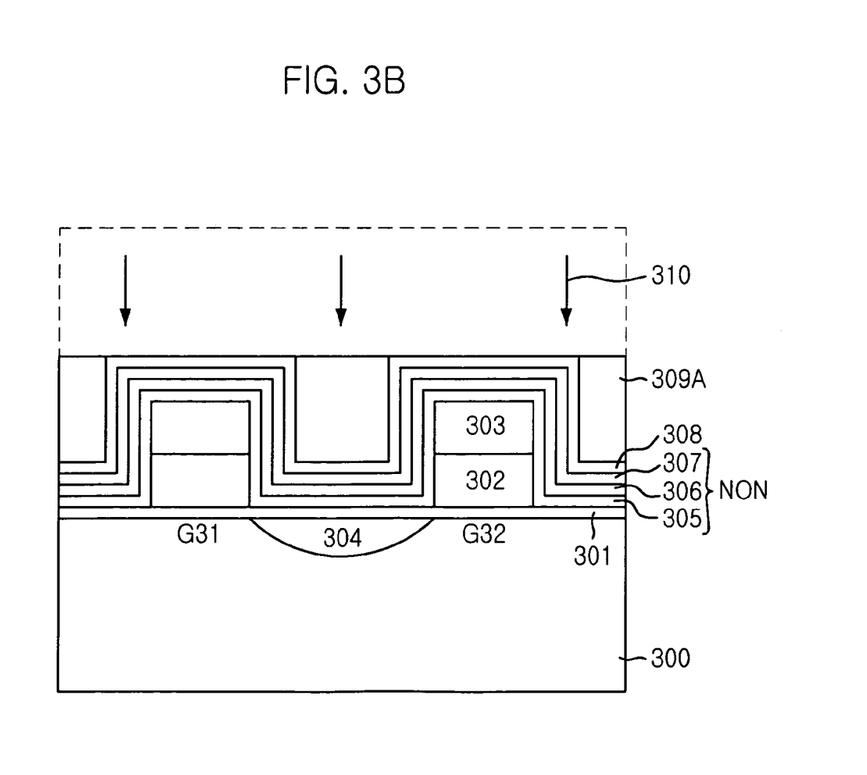

Referring to FIG. 3B, to decrease a thickness of an etch target for the SAC etching process, a portion of the inter-layer insulation layer 309 is removed by a planarization process such that the etch stop layer 308 is exposed. Herein, the reference number 310 and 309A denote the partial removal of the inter-layer insulation layer 309 and a partially planarized inter-layer insulation layer 309A, respectively.

At this time, the planarization process proceeds by employing one of a blanket etch-back process, a chemical mechanical polishing (CMP) process and a combination of the blanket etch-back process and the CMP process. Particularly, the partial planarization 310 continues until a thickness of the partially planarized inter-layer insulation layer 309A is in a range from approximately 0 Å to approximately 500 Å for the purpose of preventing the second nitride layer 307 from being lost during the partial planarization process.

Figure 3C:
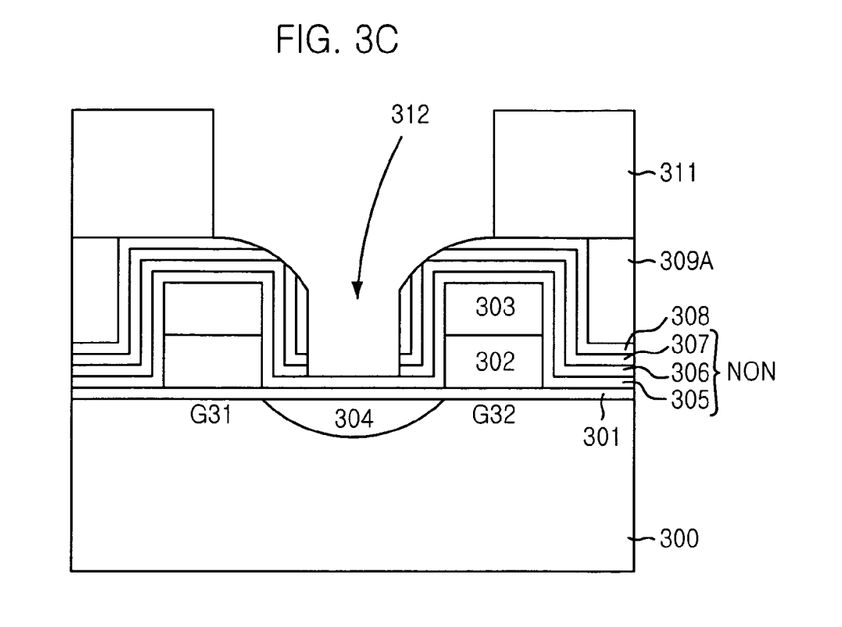

Referring to FIG. 3C, a photoresist pattern 311 is formed on the partially planarized inter-layer insulation layer 309A. At this time, the photoresist pattern 311 can be formed in one of a hole-type, a bar-type and a T-type.

Although not illustrated, the photoresist pattern 311 is formed through a series of processes. First, a photoresist for use in an ArF photolithography device or a $F_2$ photolithography device is formed on the partially planarized inter-layer insulation layer 309A by employing such a method as a spin on coating method. In case of the ArF photolithography, cyclic olefin maleic anhydride (COMA) and acrylate are examples of the photoresist. Then, predetermined portions of the photoresist are selectively photo-exposed with use of a reticle for defining a width of a contact plug and the ArF or $F_2$ photolithography device. Afterwards, a developing process makes the photo-exposed portions or non-photo-exposed portions remain. A cleaning process is then performed to remove etch remnants, thereby obtaining the photoresist pattern 311, which is a mask for opening a contact.

Also, it is possible to form an anti-reflective coating layer between the photoresist pattern 311 and the above resulting bottom semiconductor structure. Herein, the anti-reflective coating layer plays a role in preventing formation of undesired patterns caused by a scattering reflection which occurs because the partially planarized inter-layer insulation layer 309A, the etch stop layer 308 and the like have higher indices of reflection. The anti-reflective coating layer has an additional role in improving adhesiveness between the photoresist pattern 311 and the above resulting bottom semiconductor structure. The anti-reflective coating layer can be commonly made of an organic material having a similar etch characteristic with the photoresist pattern 311. It is also possible to omit the formation of the anti-reflective coating layer depending on an intended purpose of a process.

In addition to the formation of the anti-reflective coating layer, it is possible to form a hard mask between the above resulting bottom semiconductor device and the photoresist pattern 311 or between the above resulting bottom semiconductor device and the anti-reflective coating layer. The hard mask can be made of a material selected among insulating materials such as $Al_2O_3$ and nitride-based insulating materials and conducting materials such as tungsten and polysilicon.

Subsequent to the formation of the photoresist pattern 311, the aforementioned SAC etching process is performed with use of the photoresist pattern 311 as an etch mask to thereby etch the partially planarized inter-layer insulation layer 309A, the etch stop layer 308, the second nitride layer 307 and the oxide layer 306. From the SAC etching process, a contact hole 312 exposing the first nitride layer 305 is formed.

At this time, a typical recipe for the SAC etching process is used. More specifically, the SAC etching process uses a main etch gas selected from a group of fluorine-based plasma $C_xF_y$, such as $C_3F_8$, $C_4F_6$, $C_5F_8$ and $C_3F_3$. Herein, values of the subscripts x and y representing atomic ratios are in a range from approximately 1 to approximately 10. A gas for generating a polymer during the SAC etching process, e.g., $CH_2F_2$, $C_3HF_5$, $CHF_3$, or $CH_3F$ is added to the main etch gas along with a carrier gas selected from an inert gas group consisting of He, Ne, Ar and Xe. In addition to the inert gas, it is possible to use such a gas as $O_2$ or CO as the carrier gas.

After the SAC etching process, portions of the etch stop layer 308, the second nitride layer 307 and the oxide layer 306 remain as a spacer on a sidewall of each of the gate electrode structures G31 and G32 in which the contact hole 312 is formed.

As mentioned above, since the inter-layer insulation layer 309 shown in FIG. 3A is partially planarized almost at the same plane level of the etch stop layer 308, a total thickness of the etch target for the SAC etching process is reduced. Therefore, it is unnecessary to apply an over-etching recipe, thereby further preventing a decrease in a critical dimension (CD) of a bottom of the contact hole 312 and increasing a process margin.

Furthermore, the second nitride layer 307 is made of a nitride-based material having a density that allows the second nitride layer 307 to be easily removed by the SAC etching process. Thus, as simultaneous as the removal of the second nitride layer 307, the oxide layer 306 is almost removed. Since the first nitride layer 305 is made of a nitride-based material denser than that for forming the second nitride layer 307 and the etch stop layer 308, the first nitride layer 305 has a stronger etch tolerance. Hence, the SAC etching process can be easily stopped at the first nitride layer 305.

Figure 3D:
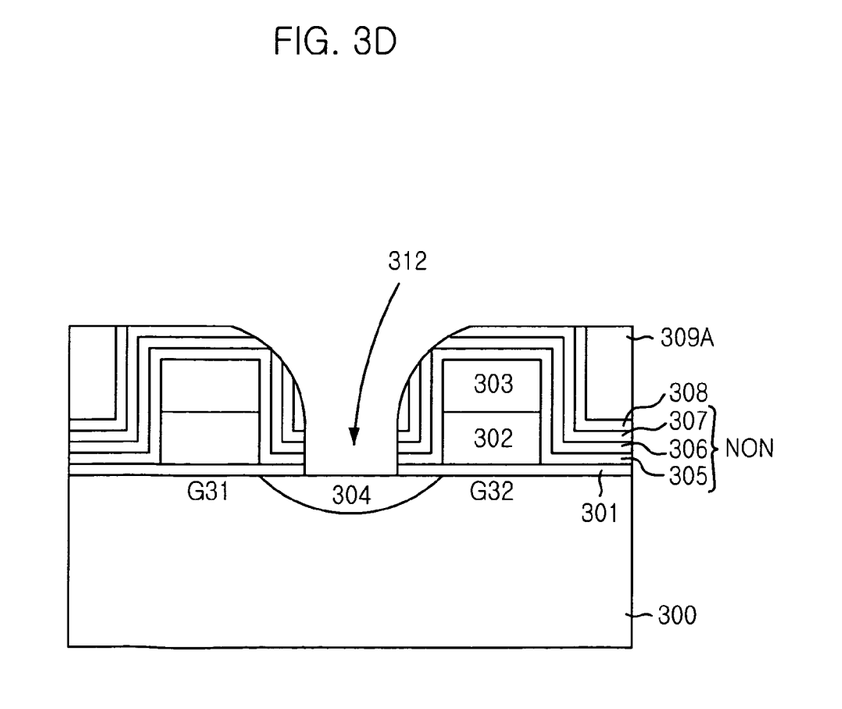

Referring to FIG. 3D, the photoresist pattern 311 shown in FIG. 3C is removed by employing a typical photoresist stripping process. Then, the first nitride layer 305 is removed by performing a blanket etch-back process to thereby proceed a contact hole opening process that causes the impurity diffusion region 304 to be exposed.

Meanwhile, in contrary to the conventional contact hole opening process, wherein the etch stop layer and the NON structure are removed, the contact hole opening process in accordance with the preferred embodiment of the present invention proceeds by removing only the first nitride layer 305. Therefore, a thickness of the etch target is reduced, thereby preventing the gate hard mask 303 from being damaged during the SAC etching process and the contact hole opening process.

After the contact hole opening process, a wet cleaning process is performed to secure a CD of a bottom of the contact hole 312 and remove etch remnants remaining after the blanket etch-back process. At this time, a cleaning solution such as buffer oxide etchant (BOE) or hydrofluoric (HF) acid is used. In case that HF acid is used, it is preferable to use a diluted HF acid obtained by mixing water with HF in a ratio of approximately 50 to approximately 500 parts of water to approximately 1 part of HF.

Figure 3E:
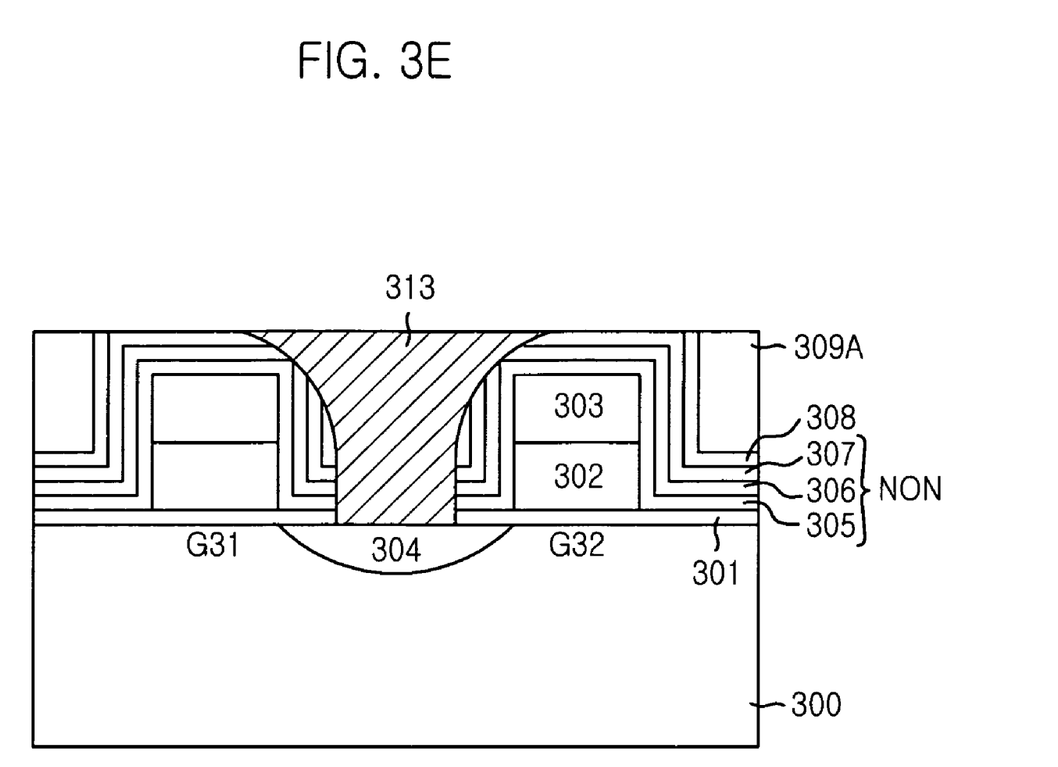

Referring to FIG. 3E, a conducting material for forming a plug is formed on the above resulting structure until the contact hole 312 is filled with the conducting material. Herein, the conducting material is typically polysilicon, and it is also possible to use the conducting material obtained by stacking polysilicon and a barrier metal such as titanium (Ti) and titanium nitride (TiN). In addition to polysilicon, tungsten can be also used as the conducting material.

Subsequent to the formation of the conducting material, a chemical mechanical polishing (CMP) process or a blanket etch-back process is performed to form a plug 313 for making an electric contact to the substrate 300 through the contact hole 311. At this time, the CMP process or the blanket etch-back process proceeds until a surface of the gate hard mask 303 is exposed. However, it is also possible to proceed the CMP process or the blanket etch-back process under a target that the inter-layer insulation layer 309 shown in FIG. 3A partially remains.

On the basis of the preferred embodiment of the present invention, a thickness of the etch target for the blanket etch-back process for opening the contact is decreased. Thus, it is possible to prevent the gate hard mask of the gate electrode structure from being damaged. Also, since a thickness of the etch target for the SAC etching process is decreased, it is possible to prevent a decrease in a CD of the bottom contact and an incidence of unopened contact. Also, because of the decreased thickness of the etch target for the SAC etching process, it is possible to prevent the conductive structures from being damaged even if the SAC becomes misaligned. As a result of these effects, yields of semiconductor devices can be enhanced.

Although the preferred embodiment of the present invention exemplifies the case of forming a plug for making a cell contact, this type of plug can be applied for a bit line contact and a storage node contact. Therefore, in case of forming a plug for a storage node contact, the impurity diffusion region is replaced with a cell contact plug or a contact pad, while the gate electrode structure is replaced with a bit line.

Also, it is possible to apply this preferred embodiment to other contact formation processes that make a bottom portion of the conductive structure exposed. One example of such contact formation process is a process for forming a metal wire contact.

The present application contains subject matter related to the Korean patent application No. KR 2003-0093096, filed in the Korean Patent Office on Dec. 18, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:

forming a plurality of conductive structures on a substrate having an impurity diffusion region, each conductive structure including a conductive layer and a hard mask;

sequentially forming a first nitride layer, an oxide layer, a second nitride layer and an etch stop layer on the plurality of conductive structures, wherein the first nitride layer is denser than the second nitride layer;

forming an inter-layer insulation layer on the etch stop layer;

partially removing the inter-layer insulation layer through a planarization process, wherein a portion of the inter-layer insulation layer having a predetermined thickness remains on the etch stop layer to protect the second nitride layer during the planarization process;

forming a photoresist pattern on the inter-layer insulation layer;

performing a self-aligned contact (SAC) etching process to selectively etch the inter-layer insulation layer, the second nitride layers, and the oxide layer by using the photoresist pattern as an etch mask until the first nitride layer is exposed to thereby form a contact hole; and removing the first nitride layer by performing a blanket etch-back process to thereby expose the impurity diffusion region in the substrate.

2. The method of claim 1, wherein predetermined thickness ranges from approximately 0 Å to approximately 500 Å.

3. The method of claim 1, wherein the second nitride layer is formed by employing a plasma enhanced chemical vapor deposition method such that the second nitride layer is removed during the SAC etching process.

4. The method of claim 1, wherein the first nitride layer is formed by employing a low pressure chemical vapor deposition method such that the SAC etching process stops at the first nitride layer.

5. The method of claim 4, wherein the first nitride layer is made of a nitride-based material selected from a group consisting of silicon nitride and silicon oxynitride.

6. The method of claim 4, wherein the first nitride layer is made of a combination of aluminum oxide ($Al_2O_3$) and tantalum nitride (TaN).

7. The method of claim 1, wherein the SAC etching process uses a main etch gas selected from a group consisting of $C_4F_6$, $C_5F_8$, $C_3F_8$, and $C_3F_3$.

8. The method of claim 7, wherein the SAC etching process further uses, in addition to the main etch gas, a gas selected from a group consisting of $CH_2F_2$, $C_3HF_5$, $CHF_3$, and $CH_3F$ for generating a polymer.

9. The method of claim 8, wherein the SAC etching process further uses a carrier gas including a gas selected from an inert gas group consisting of He, Ne, Ar and Xe for carrying the main etch gas and the gas for generating the polymer.

10. The method of claim 9, wherein the carrier gas further includes $O_2$ gas.

11. The method of claim 9, wherein the carrier gas further includes CO gas.

12. The method of claim 1, wherein the plurality of conductive structures are gate electrode structures.

13. The method of claim 1, wherein the plurality of conductive structures are bit lines.

14. The method of claim 1, wherein the plurality of conductive structures are metal wires.

15. The method of claim 1, before forming the conductive layer and the hard mask, further including the step of forming a gate insulation layer on the substrate.

16. The method of claim 1, wherein the planarization process is a chemical mechanical polishing (CMP) process.

17. The method of claim 1, wherein the planarization process is a blanket etch-back process.

18. The method of claim 1, wherein the planarization process is a combination of a CMP process and a blanket etch-back process.

* * * * *